United States Patent
Koike et al.

(10) Patent No.: US 6,725,436 B2
(45) Date of Patent: Apr. 20, 2004

(54) RESISTOR CIRCUIT

(75) Inventors: Toshiyuki Koike, Chiba (JP); Yoshihide Kanakubo, Chiba (JP); Minoru Ariyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/267,364

(22) Filed: Oct. 9, 2002

(65) Prior Publication Data

US 2003/0154456 A1 Aug. 14, 2003

(51) Int. Cl.[7] .............................................. G06F 17/50
(52) U.S. Cl. ................................................ 716/8; 716/1
(58) Field of Search ..................... 716/8, 9, 1; 337/157, 337/163, 296, 297; 338/308, 309, 334

(56) References Cited

U.S. PATENT DOCUMENTS 4,031,497 A * 6/1977 Ozawa ........................ 338/308
4,401,963 A * 8/1983 Duenke ....................... 337/282
6,532,568 B1 * 3/2003 Kotowski ....................... 716/1

FOREIGN PATENT DOCUMENTS

JP         58031426 A  *  2/1983  ............. G05F/1/64

* cited by examiner

*Primary Examiner*—Vuthe Siek
*Assistant Examiner*—Sun James Lin
(74) *Attorney, Agent, or Firm*—Adams & Wilks

(57) ABSTRACT

To provide a resistor circuit with which a resistance ratio among voltage division resistors in a semiconductor integrated circuit can be realized with high accuracy. The resistor circuit of the present invention includes: a reference resistor portion; and a resistor portion including resistor elements and fuse connected in parallel with the resistor elements, respectively, for trimming the resistor elements. The resistor elements are arranged in order from the resistor element having a largest resistance value so as to be adjacent to the reference resistor portion in the periphery of the reference resistor portion. As a result, it is possible to obtain accurately the ratio between a resistance value of a reference resistor and a desired resistance value determined with the ratio from the resistance value of the reference resistor.

6 Claims, 2 Drawing Sheets

FIG.1A
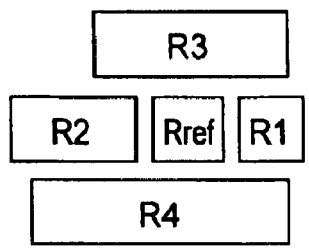
FIG.1B
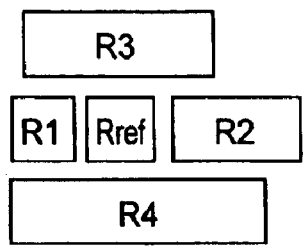
FIG.1C
FIG.1D
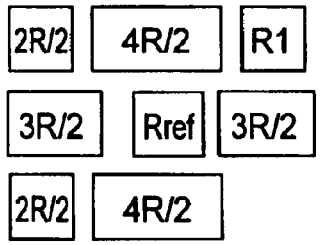
FIG.1E
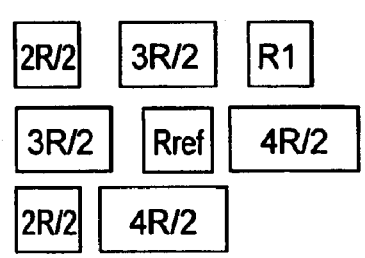
FIG.1F
FIG.2
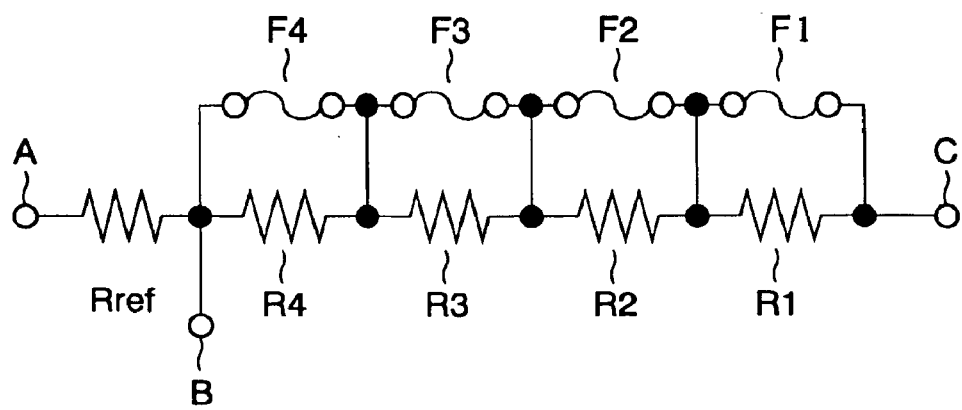

RESISTOR CIRCUIT

BACKGROUND OF THE INVENTION

1. Field of the Invention

The present invention relates in general to a resistor circuit for use in semiconductor integrated circuits, and more particularly to a layout arrangement for fabricating a voltage division circuit portion.

2. Description of the Related Art

A voltage division circuit portion for dividing a voltage developed across a terminal A and a terminal C for use in semiconductor integrated circuits, as shown in FIG. 2, includes a reference resistor portion Rref, a resistor portion consisting of several resistor elements with which a desired resistance value can be adjusted, and trimable fuses having the same number as that of the resistor elements for being used in order to determine a desired resistance value. Here, when the voltage developed across the terminals A and C is V, the voltage developed across the terminals A and B is VAB, a resistance value of the reference resistor portion between the terminals A and B is Rref, the voltage developed across the terminals B and C is VBC, and a resistance value of the resistor portion between the terminals B and C is RBC, the voltages VAB and VBC which are obtained by dividing the voltage developed across the terminals A and C are expressed by the following Expressions, respectively:

$$VAB = V \times Rref/(Rref + RBC) \quad (1)$$

$$VBC = V \times RBC/(Rref + RBC) \quad (2)$$

Since the voltage V developed across the terminals A and C is divided into VAB and VBC, the voltage developed across the terminals A and B and the voltage developed across the terminals B and C can be obtained on the basis of the resistance ratio of Rref to RBC. The value of the resistance between the terminals B and C for which the desired resistance value is required is as follows. In general, in the trimming of a resistor, the value of the resistance between the terminals B and C is adjusted to the desired resistance value. In this case, the trimming elements F1 to F4 are connected in series with one another, and also the resistors R1 to R4 are connected in parallel with the respective trimming elements. Here, it is assumed that the resistance values of the trimming elements F1, F2, F3 and F4 are RF1, RF2, RF3 and RF4, respectively. If the parallel resistance value of the trimming element F1 and the resistor R1 is assumed to be RF1//R1, then the value of the resistance between the terminals B and C is expressed by (RF1//R1)+(RF2//R2)+(RF3//R3)+(RF4//R4). In addition, in general, the resistance values RF1 to RF4 of the trimming elements F1 to F4 are negligibly smaller than the resistance values of the resistors R1 to R4. Consequently, the value of the resistance between the terminals B and C becomes (RF1+RF2+RF3+RF4) in the state in which each of the trimming elements is not cut. Here, if the trimming element F1 is cut, then the value of the resistance between the terminals B and C becomes (R1+RF2+RF3+RF4). However, since the resistance values of RF2, RF3 and RF4 are each negligibly smaller than the resistance value R1, the value of the resistance between the terminals B and C becomes roughly R1.

In addition, if the trimming elements F1 and F2 are both cut, then the value of the resistance between the terminals B and C becomes (R1+R2+RF3+RF4). However, since the resistance value (RF3+RF4) is negligibly smaller than the resistance value (R1+R2), the value of the resistance between the terminals B and C becomes roughly (R1+R2). Consequently, arbitrary one or more of the trimming elements F1 to F4 are cut, which makes it possible to adjust the value of the resistance between the terminals B and C to a desired resistance value. However, in the prior art, no arrangement of a layout pattern in the process of fabricating the above-mentioned voltage division circuit is taken into consideration at all.

The resistor portion of a semiconductor integrated circuit is made in the form of a transistor or high-resistance polysilicon, through the diffusion, or so forth. In this case, the resistor portion will hereinbelow be described by giving one made of high-resistance polysilicon as an example. The high-resistance polysilicon is made by the ion implantation and the resistance value thereof can be set on the basis of an area of a resistor element made of high-resistance polysilicon. However, since there is nonuniformity in the ion implantation and this nonuniformity is actualized in the form of the in-plane fluctuation of a chip, it is difficult to realize a resistor portion having a resistance value which is highly accurate and uniform in the whole surface of a chip.

The voltage division ratio in the voltage division circuit is determined by the ratio of the resistance of the reference resistor portion to the resistance of the resistor portion having a desired resistance value, which is the factor of generation of the large error in the resistance value in the case where the reference resistor portion and the resistor portion having a desired value are arranged separately from each other within the chip without taking the layout into consideration as in the prior art. Since the influence of the in-plane fluctuation in the resistance values due to the nonuniformity in the ion implantation is actualized in the form of the resistance-ratio error, it is difficult to realize the highly accurate voltage division circuit.

SUMMARY OF THE INVENTION

In the light of the foregoing, the present invention has been made in order to solve the above-mentioned problems associated with the prior art, and it is, therefore, an object of the present invention to provide a resistor circuit with which a resistance ratio among voltage division resistors in a semiconductor integrated circuit can be realized with high accuracy.

In order to attain the above-mentioned object, the present invention may provide that in the arrangement of a layout pattern of a voltage division circuit for use in semiconductor integrated circuits, resistor elements are arranged in order from a resistor element having a largest resistance value in the periphery of a reference resistor portion.

Therefore, according to the present invention, there is provided a resistor circuit, comprising:

a reference resistor portion; and a resistor portion including resistor elements and fuse connected in parallel with the resistor elements, respectively, for trimming the resistor elements, in which the resistor elements are arranged in order from the resistor element having the largest resistance value so as to be adjacent to the reference resistor portion in the periphery of the reference resistor portion.

BRIEF DESCRIPTION OF THE DRAWINGS

The foregoing and other objects are effected by the invention as will be apparent from the following description and claims taken in connection with the accompanying drawings, forming a part of this application, in which:

FIGS. 1A–1F are diagrams showing the arrangement of a layout pattern of the whole resistor portion in a voltage division circuit according to the present invention;

FIG. 2 is a circuit diagram showing a configuration of the whole voltage division circuit for the arrangement of the layout pattern shown in FIG. 1.

DETAILED DESCRIPTION OF THE PREFERRED EMBODIMENTS

In an arrangement of a layout pattern of a voltage circuit for use in semiconductor integrated circuits in accordance with the present invention, resistor elements are arranged in order from a resistor element having a large resistance value in the periphery of a reference resistor.

The preferred embodiments of the present invention will hereinafter be described in detail with reference to the accompanying drawings.

FIG. 1A is a diagram showing the arrangement of a layout pattern of resistor elements according to a first embodiment of the present invention. The resistor elements are arranged in order from the resistor element having the largest resistance value of several resistor elements with which a desired resistance value can be adjusted on right and left sides of a reference resistor. In FIGS. 1A–1F, reference symbol Rref designates a reference resistor portion, and reference symbols R1, R2, R3 and R4 are respectively resistor elements between the terminals B and C shown in the circuit diagram FIG. 2. The magnitude relationship among the resistor elements between the terminals B and C is expressed by $R1 \leq R2 \leq R3 \leq R4$.

FIGS. 3A–3E each show the actual layout pattern of the resistor elements corresponding to the circuit diagram shown in FIG. 2. In this case, each of the resistor elements is made of high-resistance polysilicon as an example. In FIGS. 3A–3E, the resistor elements 1 each made of high-resistance polysilicon are connected to one another through metallic wiring 2 and the resistor elements 1 each made of high-resistance polysilicon are connected to the metallic wiring through contacts 3.

Figure 3A:
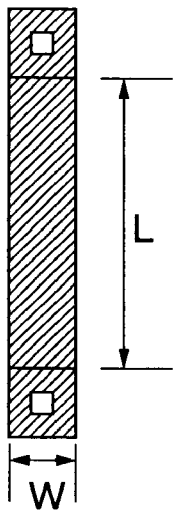
FIGS. 3A–3E are diagrams showing an example of an actual layout pattern of the resistor portion shown in FIG. 1.
Figure 3B:
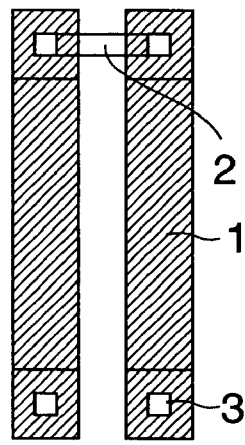
Figure 3C:
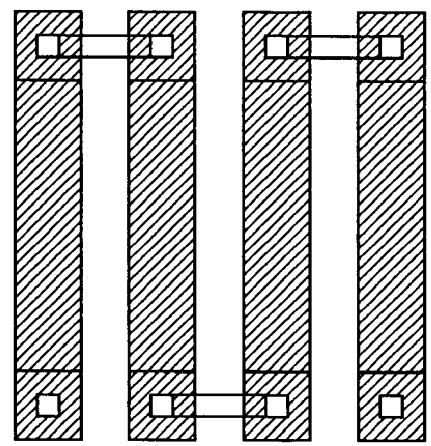
Figure 3D:
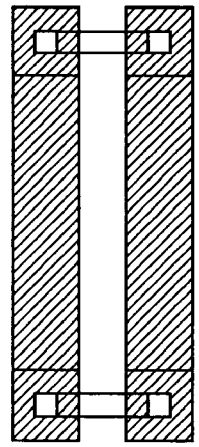
Figure 3E:
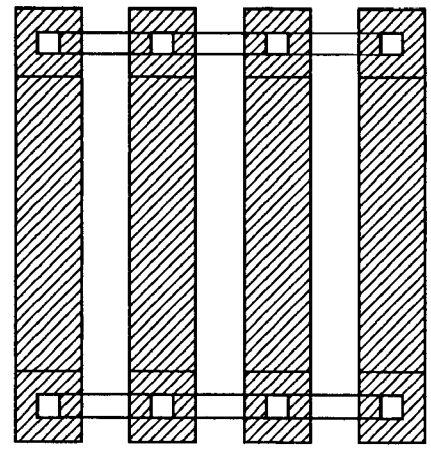

The resistance value of the resistor element is set on the basis of an area determined by a length L and a width W of the resistor element made of high-resistance polysilicon. An arbitrary number of high-resistance polysilicon resistor elements each having an arbitrary resistance value R shown in FIG. 3A are connected either in series or in parallel with one another through the metallic wiring for example, which allows a resistor portion having a desired resistance value to be fabricated. For example, in FIG. 3B, two resistors having he arbitrary resistance value R are connected in series with each other, and in this case, a resistance value 2R is obtained. In FIG. 3C, for resistors having the arbitrary resistance value R are connected in series with one another, and in this case, a resistance value 4R is obtained. In addition, FIG. 3D, two arbitrary resistors are connected in parallel with each other, and in this case, a resistance value R/2 is obtained. In FIG. 3E, four arbitrary resistors are connected in parallel with one another, and in this case, a resistance value R/4 is obtained. In this connection, the resistance value of the metallic wiring is negligibly smaller than that of the high-resistance polysilicon resistor element.

Trimming elements are connected in parallel with the respective resistor elements fabricated as described above through a metallic wiring, and thus a voltage division circuit is configured in the form of a circuit diagram shown in FIG. 2.

FIGS. 1B–1D are diagrams each showing the arrangement of a layout pattern of the resistor elements according to a second embodiment of the present invention.

The feature of this embodiment resides in that resistor elements are arranged in order from the resistor element having the largest resistance value up and down, and right and left, and right and left, and up and down in the periphery of a reference resistor portion.

FIGS. 1D and 1E are diagrams each showing the arrangement of a layout pattern of resistor elements according to a third embodiment of the present invention. The feature of this embodiment resides in that resistor elements obtained by dividing equally the resistance value of the resistor portion consisting of a several resistor elements having different resistance values with which a desired resistance value can be adjusted are put to be arranged in order from the resistor element having the largest resistance value up and down, and right and left in the periphery of a reference resistor portion.

For example, the resistance values are assumed to be so as to meet the relationship of $4 \times Rref = 4 \times R1 = 2 \times R2 = 4/3 \times R3 = R4$. Further, assuming that in the arrangement of a layout pattern, the resistance value of each of the reference resistor Rref and the resistor element R1 is obtained either by using only the resistor element shown in a part (A) of FIG. 3 or by connecting one pair of two parallel-connected resistor elements shown in a part (D) of FIG. 3 in series with each other, the resistance values of the resistor elements R2, R3 and R4 correspond to the resistance value shown in a part (B) of FIG. 3, the resistance value obtained by connecting the resistor shown in a part (A) of FIG. 3 and the resistors shown in a part (B) of FIG. 3 in series with each other, and the resistance value of the resistors shown in a part (C) of FIG. 3, respectively. In addition, a plurality of some high-resistance polysilicon resistor elements each as the reference resistor as shown in a part (A) of FIG. 3 are connected through the metallic wiring, thereby fabricating the resistors having the desired resistance value as shown in parts (B) to (E) of FIG. 3. Consequently, even if for parts (B) to (E) of FIG. 3, the high-resistance polysilicon resistor elements are divisionally arranged away from one another, these resistor elements may be connected to one another through the metallic wiring to fabricate the resistors having the desired resistance value.

Parts (E) and (F) of FIG. 1 are diagrams each showing the arrangement of a layout pattern of resistor elements according to a fourth embodiment of the present invention. The feature of this embodiment is that resistor elements obtained by dividing equally the resistance value of the resistor portion consisting of several resistor elements having different resistance values with which a desired resistance value can be adjusted are put to be arranged in order from the resistor element having the largest resistance value up and down, and right and left, and right and left, and up and down in the periphery of a reference resistor portion.

As set forth hereinabove, according to the present invention, the adoption of the configuration as described above offers the following effects peculiar to the present invention: It is possible to obtain accurately the ratio between a resistance value of a reference value of a reference resistor and a desired resistance value determined with the ratio from the resistance value of the reference resistor. The failure generation rate, as a result, is reduced, which leads to the cost cutbacks.

As many apparently widely different embodiments of this invention may be made without departing from the spirit and scope thereof, it is to be understood that the invention is not limited to the specific embodiments thereof except as defined in the appended claims.

What is claimed is:

1. A resistor circuit, comprising: a first resistor; a plurality of second resistors each having different resistance values connected to the first resistor, the second resistors being arranged so that respective second resistors having larger resistance values are closer in proximity to the first resistor than those having smaller resistance values; and trimmable fuses connected in parallel to respective ones of the second resistors.

2. A resistor circuit according to claim 1; further comprising first, second and third terminals, the first resistor being connected across the first and second terminals and the second resistors being connected across the second and third terminals.

3. A resistor circuit according to claim 1; wherein the second resistors comprise polysilicon resistors.

4. A resistor circuit according to claim 3; wherein the second resistors are arranged on opposite sides of the first resistor.

5. A resistor circuit according to claim 3; wherein the second resistors are arranged about a periphery of the first resistor.

6. A resistor circuit according to claim 3; wherein each of the second resistors comprise one or more polysilicon resistors connected to each other to form a desired resistance value.

* * * * *